United States Patent
Choi et al.

(10) Patent No.: US 9,698,198 B2
(45) Date of Patent: Jul. 4, 2017

(54) MEMORY DEVICE INCLUDING A PROTECTION INSULATING PATTERN

(71) Applicant: SAMSUNG ELECTRONICS CO., LTD., Suwon-si, Gyeonggi-do (KR)

(72) Inventors: Young-Seok Choi, Yongin-si (KR); Jaehun Seo, Suwon-si (KR); Hyun-woo Yang, Suwon-si (KR); Jongchul Park, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/602,490

(22) Filed: Jan. 22, 2015

(65) Prior Publication Data

US 2015/0311253 A1   Oct. 29, 2015

(30) Foreign Application Priority Data

Apr. 28, 2014  (KR) .................. 10-2014-0050870

(51) Int. Cl.
 *H01L 29/66* (2006.01)
 *H01L 27/22* (2006.01)
 *H01L 43/08* (2006.01)
 *H01L 43/12* (2006.01)

(52) U.S. Cl.
 CPC ............ *H01L 27/228* (2013.01); *H01L 43/08* (2013.01); *H01L 43/12* (2013.01)

(58) Field of Classification Search
 CPC .......... H01L 27/22; H01L 43/08; H01L 43/02
 See application file for complete search history.

(56) References Cited

U.S. PATENT DOCUMENTS

| | | | |
|---|---|---|---|
| 8,138,562 B2 | 3/2012 | Mao | |
| 8,264,053 B2 | 9/2012 | Tsukamoto et al. | |
| 8,455,965 B2* | 6/2013 | Li | B82Y 25/00 257/295 |
| 2004/0087163 A1* | 5/2004 | Steimle | B82Y 10/00 438/694 |
| 2005/0160585 A1* | 7/2005 | Kim | B82Y 10/00 29/603.01 |
| 2007/0181964 A1* | 8/2007 | Shoji | H01L 27/228 257/421 |
| 2011/0037108 A1 | 2/2011 | Sugiura et al. | |

(Continued)

FOREIGN PATENT DOCUMENTS

| | | |
|---|---|---|
| JP | 2012204431 A | 10/2012 |
| KR | 2003-0088574 A | 11/2003 |
| KR | 2008-0105612 A | 12/2008 |

*Primary Examiner* — Caleb Henry
(74) *Attorney, Agent, or Firm* — Lee & Morse, P.C.

(57) ABSTRACT

Provided is a memory device, including a memory element on a substrate; a protection insulating pattern covering a side surface of the memory element and exposing a top surface of the memory element; an upper mold layer on the protection insulating pattern; and a bit line on and connected to the memory element, the bit line extending in a first direction, the protection insulating pattern including a first protection insulating pattern covering a lower side surface of the memory element; and a second protection insulating pattern covering an upper side surface of the memory element and including a different material from the first protection insulating pattern.

17 Claims, 19 Drawing Sheets

(56) References Cited

U.S. PATENT DOCUMENTS

| | | | |
|---|---|---|---|
| 2012/0146125 A1* | 6/2012 | Kim | H01L 27/11524 |
| | | | 257/321 |
| 2012/0306033 A1* | 12/2012 | Satoh | H01L 27/222 |
| | | | 257/421 |
| 2013/0171743 A1 | 7/2013 | Lee et al. | |
| 2013/0242634 A1* | 9/2013 | Fukuzumi | G11C 19/0808 |
| | | | 365/80 |
| 2015/0069556 A1* | 3/2015 | Yamakawa | H01L 43/02 |
| | | | 257/421 |

\* cited by examiner

MEMORY DEVICE INCLUDING A PROTECTION INSULATING PATTERN

CROSS-REFERENCE TO RELATED APPLICATION

Korean Patent Application No. 10-2014-0050870, filed on Apr. 28, 2014, in the Korean Intellectual Property Office, and entitled: "Memory Device," is incorporated by reference herein in its entirety.

BACKGROUND

1. Field

Example embodiments relate to a semiconductor device, for example, to a memory device.

2. Description of the Related Art

Increased demand for electronic devices with fast speed and/or low power consumption may require semiconductor devices with fast operating speeds and/or low operating voltages. A magnetic memory device may satisfy such requirements. For example, a magnetic memory device may provide technical advantages, such as low latency and non-volatility, and a magnetic memory device may be regarded as an emerging next-generation memory device.

SUMMARY

Embodiments may be realized by providing a memory device, including a memory element on a substrate; a protection insulating pattern covering a side surface of the memory element and exposing a top surface of the memory element; an upper mold layer on the protection insulating pattern; and a bit line on and connected to the memory element, the bit line extending in a first direction, the protection insulating pattern including a first protection insulating pattern covering a lower side surface of the memory element; and a second protection insulating pattern covering an upper side surface of the memory element and including a different material from the first protection insulating pattern.

The bit line may be in direct contact with the top surface of the memory element, and the second protection insulating pattern may be between the bit line and the first protection insulating pattern.

The memory device may further include a lower mold layer between the substrate and the upper mold layer. The memory element may be in the lower mold layer, the first protection insulating pattern may be between the memory element and the lower mold layer, and the second protection insulating pattern may include a portion between the lower and upper mold layers.

The second protection insulating pattern may include metal oxide.

The second protection insulating pattern may include aluminum oxide, titanium oxide, or tantalum oxide.

The first protection insulating pattern may include silicon nitride or silicon oxynitride.

The memory element pattern may include a lower electrode; a magnetic tunnel junction on the lower electrode, the magnetic tunnel junction including a pinned layer, a free layer, and a tunnel barrier between the pinned and free layers; and an upper electrode on the magnetic tunnel junction.

The first protection insulating pattern may cover a side surface of the magnetic tunnel junction and a lower side surface of the upper electrode.

The second protection insulating pattern may be spaced apart from the magnetic tunnel junction and may cover an upper side surface of the upper electrode.

The memory device may further include a gate electrode, at least one interlayer insulating layer, and a contact plug. The substrate may include a cell active pattern extending in the first direction, the gate electrode may cross the cell active pattern, the cell active pattern may include first and second doped regions at both sides of the gate electrode, the at least one interlayer insulating layer may cover the substrate, the contact plug may be disposed through the at least one interlayer insulating layer and may be connected to the second doped region, and the memory element may be on the interlayer insulating layer and may be electrically connected to the second doped region via the contact plug.

The upper mold layer may be formed to include a bit line groove extending across the gate electrode, and the bit line may be in the bit line groove.

The memory device may further include a plurality of additional memory elements, which are arranged in the first direction to have the same structure as the memory element. The bit line may be in common and direct contact with top surfaces of the memory element and the plurality of additional memory elements.

The bit line groove may penetrate the second protection insulating pattern.

The bit line may be in contact with upper portions of both side surfaces of the memory element facing each other in the first direction.

Embodiments may be realized by providing a memory device, including a plurality of magnetic memory elements arranged on a substrate; a mold layer between the magnetic memory elements; a protection insulating pattern provided between the magnetic memory elements and the mold layer, the protection insulating pattern exposing top surfaces of the magnetic memory elements; and an interconnection line in common contact with the top surfaces of the magnetic memory elements, the protection insulating pattern including a first protection insulating pattern covering lower side surfaces of the magnetic memory elements; and a second protection insulating pattern covering upper side surfaces of the magnetic memory elements and including a different material from the first protection insulating pattern.

The interconnection line may be in direct contact with the top surfaces of the magnetic memory elements, and the second protection insulating pattern may be between the interconnection line and the first protection insulating pattern.

Embodiments may be realized by providing a method of fabricating a memory device, including forming memory elements on a semiconductor substrate; forming a first protection insulating pattern on the memory elements to expose top and upper side surfaces of the memory elements; forming a second protection insulating layer on the memory elements and the first protection insulating pattern, the second protection insulating layer being formed of a material different from the first protection insulating pattern; forming an upper mold layer on the second protection insulating layer; patterning the upper mold layer to form an opening overlapped with the memory elements to expose a portion of the second protection insulating layer; removing the exposed portion of the second protection insulating layer to form a second protection insulating pattern exposing the top surfaces of the memory elements and covering side surfaces of the memory elements; and forming a conductive pattern in the opening, the conductive pattern being in contact with the top surfaces of the memory elements.

Forming the first protection insulating pattern may include forming a first protection insulating layer on the memory elements; forming a lower mold layer on the first protection insulating layer to fill gap regions between the memory elements; and removing a portion of the first protection insulating layer exposed by the lower mold layer.

The second protection insulating layer may be formed to include at least a portion extending on the lower mold layer.

Forming the opening may include forming a hard mask pattern on the upper mold layer, and the hard mask pattern may be a titanium nitride layer formed at temperature of 300° C. or lower.

Embodiments may be realized by providing a memory device, including a magnetic memory element on a substrate; a first protection insulating layer covering a side surface of the magnetic memory element and including nitrogen; and a second protection insulating layer on the first protection insulating layer, exposing a top surface of the magnetic memory element, and including a nitrogen-free material; and an upper mold layer on the second protection insulating layer, the second protection insulating layer having a higher etch selectivity with respect to the upper mold layer than that of the first protection insulating layer.

The second protection insulating layer and the upper mold layer may have an etch selectivity of about 10:1 or higher.

The second protection insulating layer may include a metal oxide.

The first protection insulating layer may include silicon nitride or silicon oxynitride; and the second protection insulating layer may include aluminum oxide, titanium oxide, or tantalum oxide.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
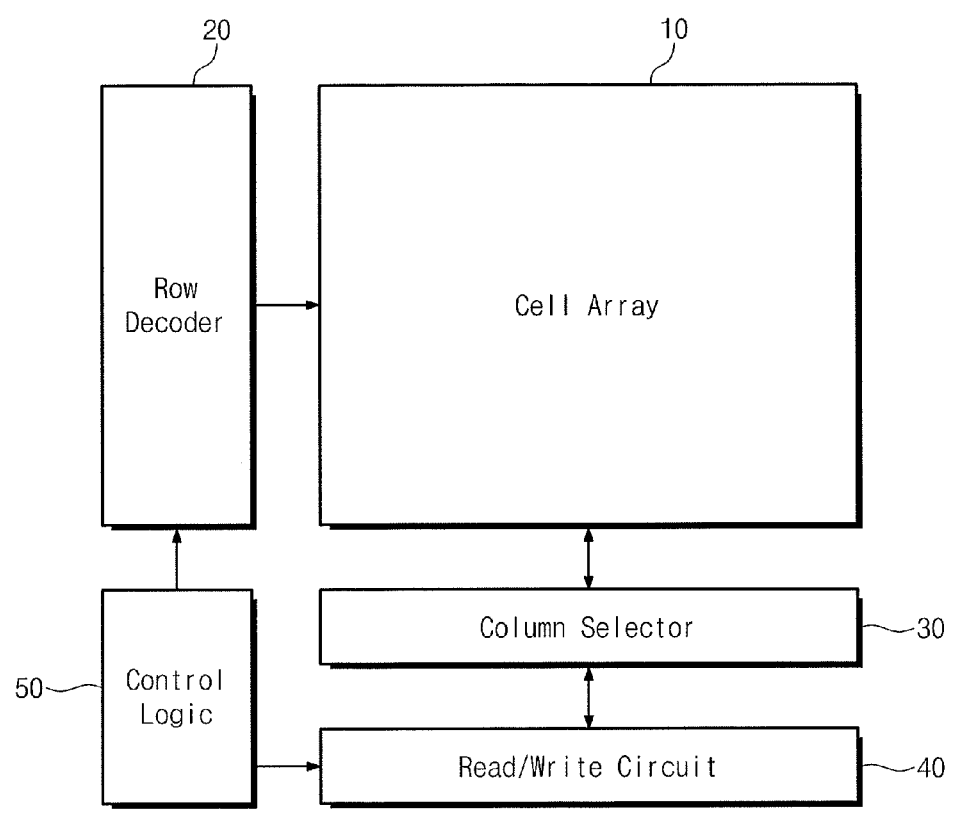
FIG. 1 illustrates a block diagram of a memory device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "under" versus "directly under", "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 illustrates a block diagram of a memory device according to example embodiments. Referring to FIG. 1, a memory device may include a memory cell array 10, a row decoder 20, a column selection circuit 30, a read and write circuit 40, and a control logic 50.

The memory cell array 10 may include a plurality of word lines, a plurality of bit lines, and a plurality of memory cells provided at intersections between the word and bit lines. The structure of the memory cell array 10 will be described with reference to FIG. 2.

The row decoder 20 may be connected to the memory cell array 10 through the word lines. The row decoder 20 may be configured to decode address information input from the outside and thereby to select one of the word lines.

The column selection circuit 30 may be connected to the memory cell array 10 through the bit lines and may be configured to decode address information input from the outside and thereby to select one of the bit lines. The bit line selected by the column selection circuit 30 may be connected to the read and write circuit 40.

The read and write circuit 40 may provide a bit line bias for accessing to the selected memory cell, in response to control signals from the control logic 50. Further, the read and write circuit 40 may provide the bit line voltage to the selected bit line for writing or reading data to or from the memory cell.

The control logic 50 may output control signals for controlling the semiconductor memory device, in response to command signals input from the outside. The control signals output from the control logic 50 may be used to control the read and write circuit 40.

Figure 2:
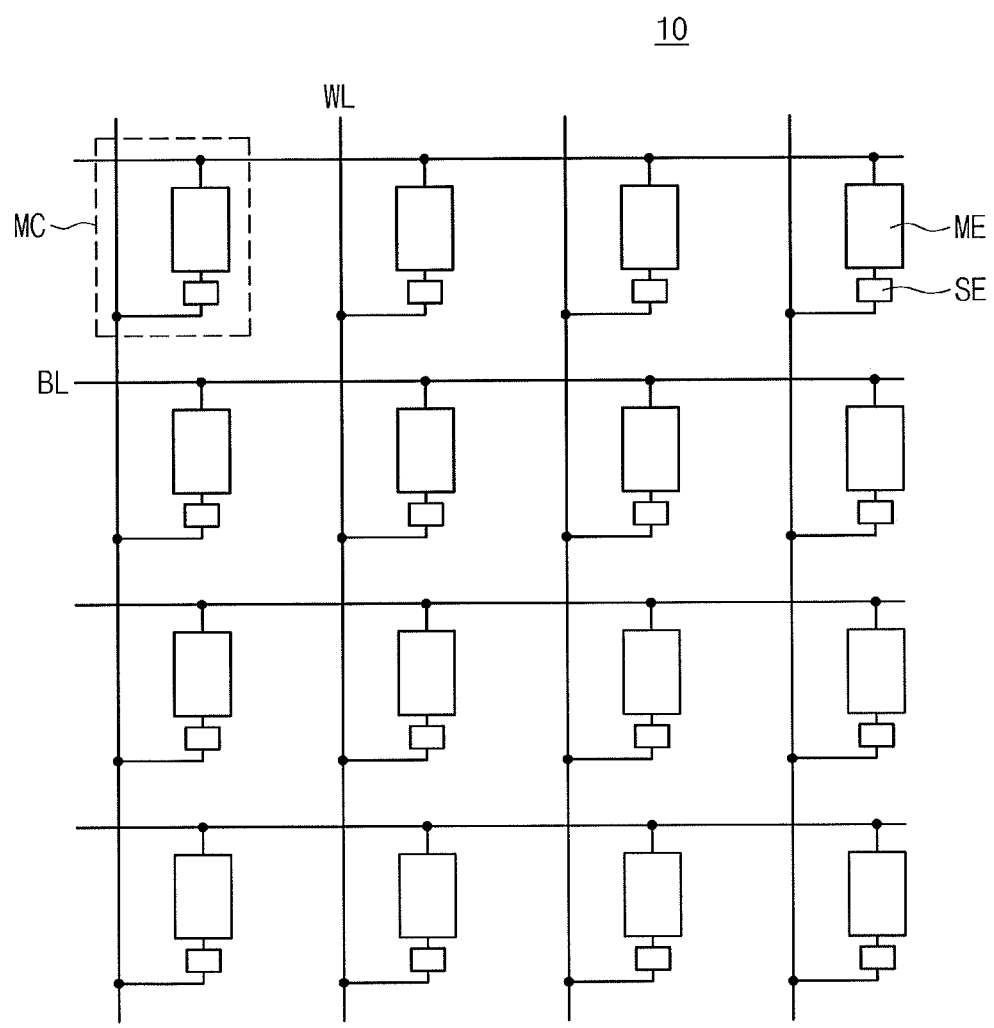
FIG. 2 illustrates a circuit diagram of a memory cell array of a memory device according to example embodiments.

FIG. 2 illustrates a circuit diagram of a memory cell array of a memory device according to example embodiments. Referring to FIG. 2, the memory cell array 10 may include a plurality of first conductive lines, a plurality of second conductive lines, and a plurality of unit memory cells MC. In example embodiments, the first conductive lines may serve as word lines WL, and the second conductive lines may serve as bit lines BL. The unit memory cells MC may be two- or three-dimensionally provided. The word lines WL and the bit lines BL may be provided to cross each other, and each of the unit memory cells MC may be provided at a corresponding one of intersections between the word lines WL and the bit lines BL. Each of the word lines WL may be connected to a plurality of the unit memory cells MC. Each of the bit lines BL may be connected to a corresponding one of the unit memory cells MC connected to a specific one of the word lines WL, and the unit memory cells MC may be connected to the read and write circuit 40, described with reference to FIG. 1, through the bit lines BL.

Each of the unit memory cells MC may include a memory element ME and a selection element SE. The memory element ME may be provided between the bit line BL and the selection element SE, and the selection element SE may be provided between the memory element ME and the word line WL. The memory element ME may be a variable resistance device, whose resistance can be switched to one of at least two values, depending on an electric pulse applied thereto.

In example embodiments, the memory element ME may be formed to have a layered structure, whose electric resistance can by changed by a spin transfer process using an electric current passing therethrough. For example, the memory element ME may have a layered structure configured to exhibit a magneto-resistance property and may include at least one ferromagnetic material and/or at least one antiferromagnetic material. In example embodiments, the memory element ME may be a magnetic memory element with a magnetic tunnel junction MJT.

The selection element SE may be configured to selectively control an electric current passing through the memory element ME. For example, the selection element SE may be one of a diode, a pnp bipolar transistor, an npn bipolar transistor, an NMOS (n-channel metal-oxide-semiconductor) field effect transistor (FET), and a PMOS (p-channel metal-oxide-semiconductor) FET. The selection element SE may be a three-terminal switching device (e.g., a bipolar transistor or a MOSFET), and an additional interconnection line may be connected to a control electrode or gate of the selection element SE.

Figure 3A:
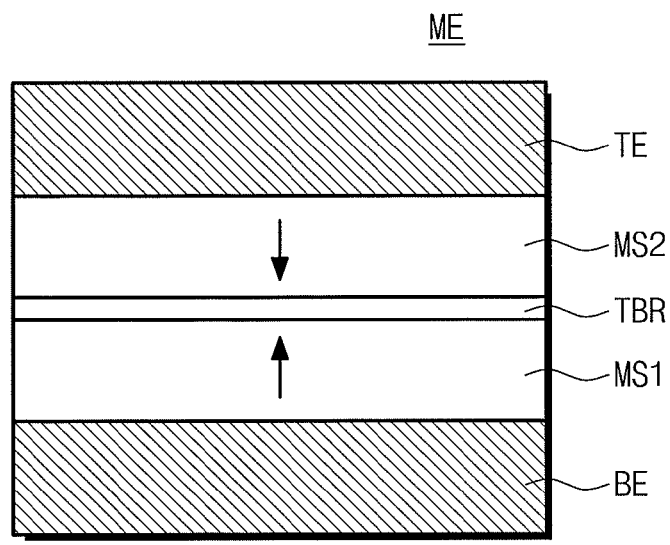
FIGS. 3A and 3B illustrate schematic diagrams of magnetic tunnel junctions according to example embodiments.
Figure 3B:
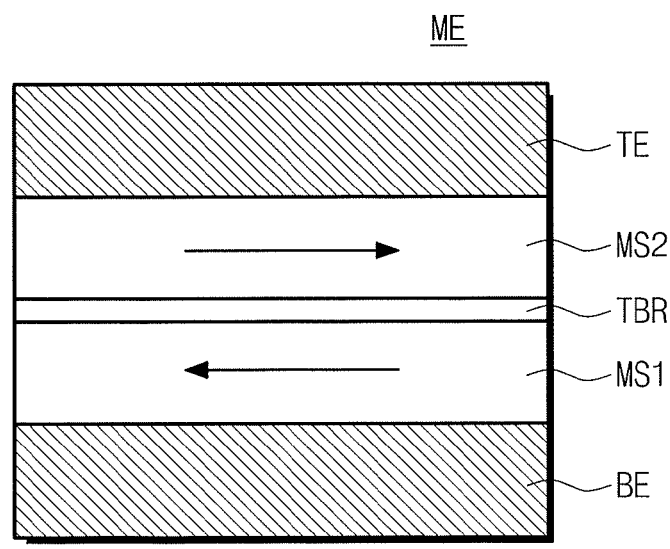

FIGS. 3A and 3B illustrate schematic diagrams of magnetic tunnel junctions MTJs according to example embodiments. FIGS. 3A and 3B illustrate enlarged views of a portion A of FIG. 5. Referring to FIGS. 3A and 3B, the magnetic tunnel junction MJT may include a first magnetic layer MS1, a second magnetic layer MS2, and a tunnel barrier TBR therebetween. Each of the first and second magnetic layers MS1 and MS2 may be formed of or include at least one magnetic material. The magnetic tunnel junction MJT may be interposed between a lower electrode BE and an upper electrode TE.

One of the first and second magnetic layers MS1 and MS2 may be configured to have a fixed magnetization direction that is not changed by an external magnetic field generated under usual environments. In the present specification, for convenience in description, a term 'pinned layer PNL' will be used to represent a magnetic layer exhibiting such a fixed magnetization property. The other of the first and second magnetic layers MS1 and MS2 may be configured to have a magnetization direction that can be switched by applying an external magnetic field thereto. Hereinafter, a term 'free layer FRL' will be used to represent a magnetic layer exhibiting such a switchable magnetization property. The magnetic tunnel junction MTJ may include at least one free layer FRL and at least one pinned layer PNL separated by the tunnel barrier TBR.

Electric resistance of the magnetic tunnel junction MTJ may be sensitive to a relative orientation of magnetization directions of the free and pinned layers FRL and PNL. For example, the electric resistance of the magnetic tunnel junction MTJ may be far greater when the relative orientation is antiparallel than when the relative orientation is parallel. The electrical resistance of the magnetic tunnel junction MTJ can be controlled by changing the magnetization direction of the free layer FRL. Such a difference in electric resistance of the magnetic tunnel junction MTJ may be used to represent two different states of data stored in the memory element ME. The magnetization direction of the free layer FRL may be changed by a writing operation using a spin-transfer torque effect.

As an example, as shown in FIG. 3A, each of the first and second magnetic layers MS1 and MS2 may have a magnetization direction that is substantially normal to a top surface of a substrate 100. The first and second magnetic layers MS1 and MS2 may be configured to serve as the pinned and free layers PNL and FRL, respectively. In an embodiment, the first and second magnetic layers MS1 and MS2 may be configured to serve as the free and pinned layers FRL and PNL, respectively.

Each of the pinned and free layers PNL and FRL may include at least one ferromagnetic layer. The pinned layer PNL may further include an antiferromagnetic layer pinning or fixing a magnetization direction of the ferromagnetic layer in the pinned layer PNL. The tunnel barrier TBR may be formed of or include at least one of magnesium oxide, titanium oxide, aluminum oxide, magnesium-zinc oxide, or magnesium-boron oxide.

As another example, as shown in FIG. 3B, each of the first and second magnetic layers MS1 and MS2 may have a magnetization direction parallel to the top surface of the substrate 100. The first and second magnetic layers MS1 and MS2 may be configured to serve as the pinned and free layers PNL and FRL, respectively. In an embodiment, the first and second magnetic layers MS1 and MS2 may be configured to serve as the free and pinned layers FRL and PNL, respectively.

Each of the pinned and free layers PNL and FRL may include at least one of perpendicular magnetic materials (e.g., CoFeTb, CoFeGd, or CoFeDy), perpendicular magnetic materials with $L1_0$ structure, CoPt with a hexagonal close packing (HCP) structure, or a perpendicular magnetic structure. The perpendicular magnetic materials with the $L1_0$ structure may include at least one of $L1_0$ FePt, $L1_0$ FePd, $L1_0$ CoPd, or $L1_0$ CoPt. The perpendicular magnetic structure may include magnetic and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where the subscript n denotes the stacking number. In certain embodiments, the pinned layer PNL may be thicker than the free layer FRL and/or it may be configured to have a coercive force greater than that of the free layer FRL. The tunnel barrier TBR may be formed of or include at least one of magnesium oxide, titanium oxide, aluminum oxide, magnesium-zinc oxide, or magnesium-boron oxide.

Figure 4:
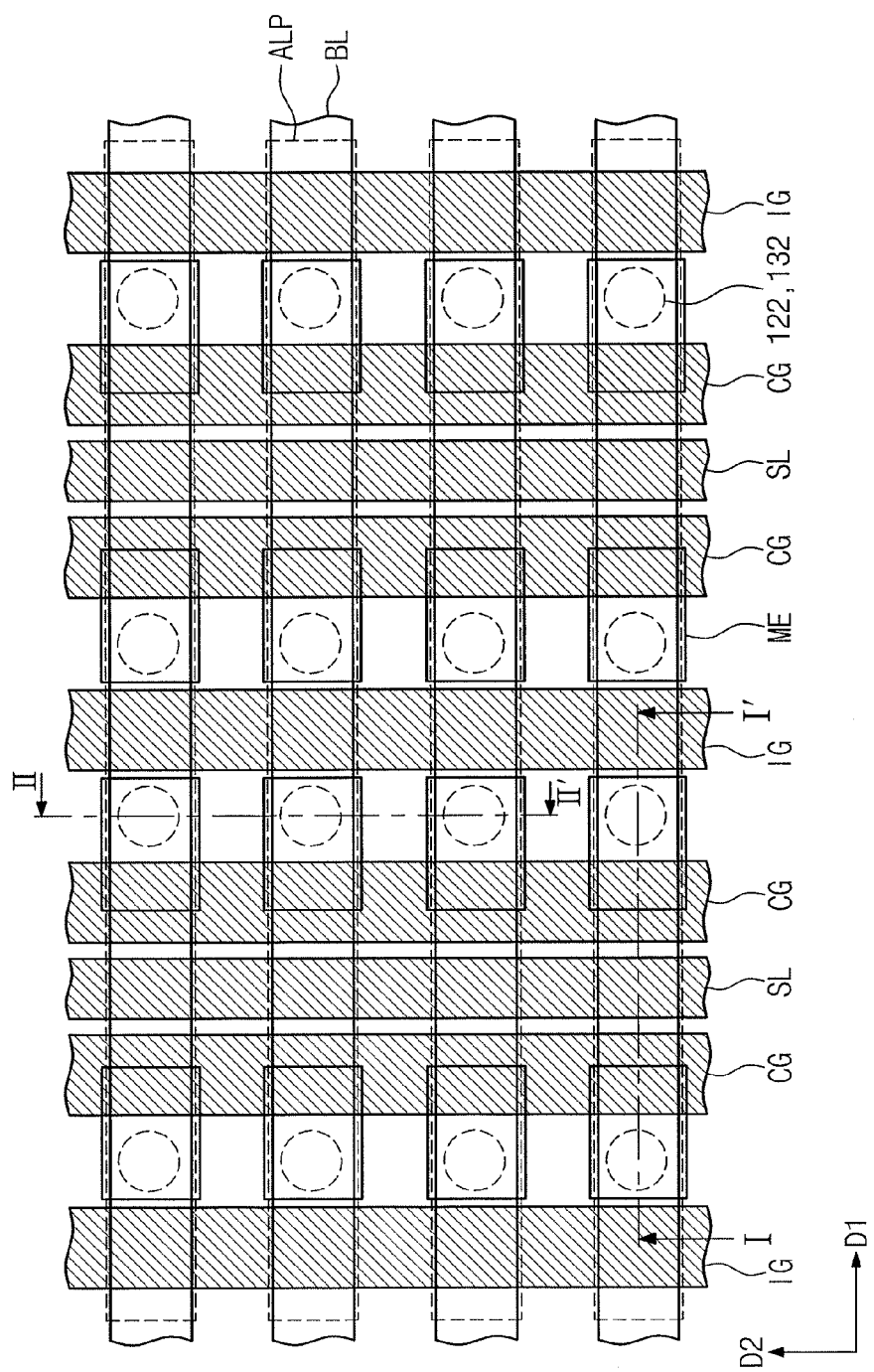
FIG. 4 illustrates a plan view of a memory device according to example embodiments.
Figure 5:
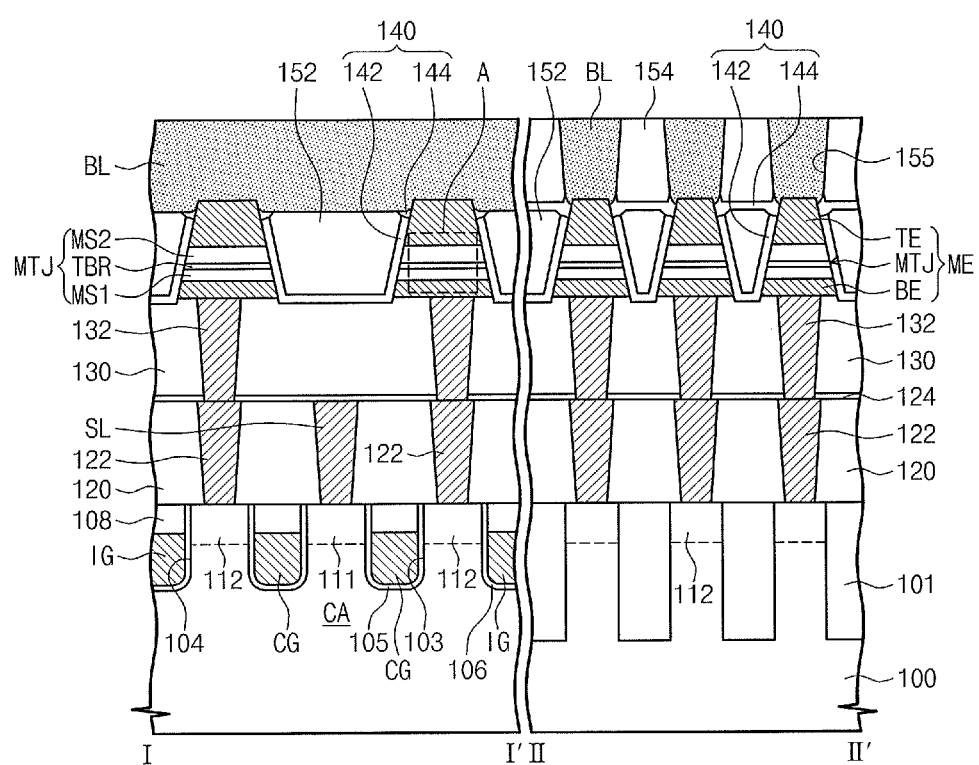
FIG. 5 illustrates a sectional view taken along lines I-I' and II-II' of FIG. 4.

FIG. 4 illustrates a plan view of a memory device according to example embodiments, and FIG. illustrates is a sectional view taken along lines I-I' and II-II' of FIG. 4. Referring to FIGS. 4 and 5, a semiconductor substrate 100 may be a silicon substrate, a germanium substrate, and/or a silicon-germanium substrate. The semiconductor substrate 100 may be prepared to have a first conductivity type. Device isolation patterns 101 may be formed in the semiconductor substrate 100. The device isolation patterns 101 may define active line patterns ALP. As shown in FIG. 4, when viewed in plan view, each of the active line patterns ALP may be a line-shaped pattern extending parallel to a first direction D1. The device isolation patterns 101 and the active line patterns ALP may be alternatingly arranged in a second direction D2 that is perpendicular to the first direction D1. In certain embodiments, the active line patterns ALP may be doped to have the first conductivity type.

The semiconductor substrate 100 may include isolation recess regions 104 that are provided to cross the active line patterns ALP and the device isolation patterns 101. When viewed in plan view, each of the isolation recess regions 104 may be shaped like a groove and may extend parallel to the second direction D2. The isolation recess regions 104 may be provided in such a way that each of the active line patterns ALP is sectioned into a plurality of active patterns CA. Each of the active patterns CA may be a portion of each active line pattern ALP between an adjacent pair of the isolation recess regions 104. Each of the active patterns CA may be defined by an adjacent pair of the device isolation patterns 101 and an adjacent pair of the isolation recess regions 104. When viewed in plan view, the active patterns CA may be disposed spaced apart from each other in both of the first and second directions to form a matrix-shaped arrangement.

Gate recess regions 103 may be formed to cross the active patterns CA arranged along the second direction D2. Each of the gate recess regions 103 may be shaped like a groove and may extend parallel to the isolation recess regions 104. In example embodiments, a pair of the gate recess regions 103 may cross each of the active patterns CA, and a pair of cell transistors may be formed on each of the active patterns CA.

The gate recess regions 103 may have substantially the same depth as the isolation recess regions 104. A width of each of the gate recess regions 103 may be substantially equal to or different from that of the isolation recess regions 104. The depth of the gate and isolation recess regions 103 and 104 may be smaller than depths of bottom surfaces of the device isolation patterns 101.

Gate electrodes CG may be provided in the gate recess regions 103, respectively. A gate dielectric layer 105 may be provided between the gate electrode CG and the gate recess region 103. Due to the shape of the gate recess region 103, the gate electrode CG may be a line-shape structure extending parallel to the second direction D2. Each cell transistor may include the gate electrode CG and a channel region, which has a recessed profile and faces the gate electrode CG.

Isolation gate electrodes IG may be provided in the isolation recess regions 104, respectively. An isolation gate dielectric layer 106 may be provided between the isolation gate electrode IG and the isolation recess region 104. The isolation gate electrode IG may be a line-shape structure extending parallel to the second direction D2.

A gate mask pattern 108 may be provided on each of the cell and isolation gate electrodes CG and IG. The cell and isolation gate electrodes CG and IG may have top surfaces lower than the top entrances of the cell and isolation recess regions 103 and 104. The gate mask pattern 108 may be provided in an upper portion of each of the cell and isolation recess regions 103 and 104. The gate mask pattern 108 may have a top surface that is substantially coplanar with that of the semiconductor substrate 100.

In operation of the magnetic memory device, an isolation voltage may be applied to the isolation gate electrodes IG. The isolation voltage may prevent a channel or inversion layer from being formed below the isolation recess regions 104. When the isolation gate electrodes IG are applied with the isolation voltage, isolation channel regions positioned below the isolation gate electrodes IG may be turned-off, and the active patterns CA of each active line pattern ALP may be electrically separated from each other. For example, the active line patterns ALP may be doped with p-type dopants, and the isolation voltage may be a ground or negative voltage.

For example, the cell gate electrode CG may be formed of or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide). In example embodiments, the isolation gate electrode IG may be formed of the same material as the cell gate electrode CG. The cell and isolation gate dielectric layers 105 and 106 may be formed of or include, for example, silicon oxide, silicon nitride, silicon oxynitride, and/or high-k dielectric materials including insulating metal oxides (e.g., hafnium oxide or aluminum oxide). The gate mask pattern 108 may include, for example, silicon oxide, silicon nitride, and/or silicon oxynitride.

A first doped region 111 may be provided in each of the active patterns CA and between each adjacent pair of the cell gate electrodes CG. Second doped regions 112 may be provided in the active patterns CA and between the cell and isolation gate electrodes CG and IG. In example embodiments, the first doped region 111 may be provided in a central region of each of the active patterns CA, a pair of the second doped regions 112 may be respectively provided in edge regions of each of the active patterns CA, and the pair of cell transistors formed on each active pattern CA may share the first doped region 111. The first and second doped regions 111 and 112 may serve as source and drain regions of the cell transistor. The first and second doped regions 111 and 112 may be doped to have a second conductivity type different from the first conductivity type. One of the first and second conductivity types may be an n-type, and the other may be a p-type. The cell transistor may be used as the selection element SE of FIG. 2.

Further, a first interlayer insulating layer 120 may be provided on the semiconductor substrate 100. The first interlayer insulating layer 120 may be formed to have source grooves, and source lines SL may be provided to fill the source grooves, respectively. The source lines SL may extend parallel to the second direction D2. Each source line SL may be formed of or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide). Each source line SL may connect the first doped regions 111, which are arranged in the second direction D2, to each other. Further, the first interlayer insulating layer 120 may be formed to have first contact holes, and first contact plugs 122 may be respectively provided in the first contact holes and may be respectively connected to the second doped regions 112. The first contact plugs 122 may be formed of the same conductive material as the source lines SL. The source lines SL and the first contact plugs 122 may have top surfaces that are substantially coplanar with that of the first interlayer insulating layer 120.

A capping insulating layer 124 may be provided on the first interlayer insulating layer 120. The capping insulating layer 124 may be formed to cover the top surfaces of the source lines SL. The source lines SL may be formed of or include a metallic material, and the capping insulating layer 124 may be formed of an insulating material capable of preventing the metallic material in the source lines SL from being diffused into a second interlayer insulating layer 130 thereon. Further, the capping insulating layer 124 may be formed of an insulating material having an etch selectivity with respect to the first interlayer insulating layer 120. For example, the first interlayer insulating layer 120 may be formed of silicon oxide, and the capping insulating layer 124 may be formed of silicon nitride and/or silicon oxynitride.

The second interlayer insulating layer 130 may be provided on the capping insulating layer 124. The second interlayer insulating layer 130 may be formed of silicon oxide.

Second contact plugs 132 may be provided to penetrate all of the second interlayer insulating layer 130 and the capping insulating layer 124. The second contact plugs 132 may be electrically connected to the second doped regions 112, respectively, via the first contact plugs 122. In example embodiments, ohmic patterns (not shown) may be provided between the first and second contact plugs 122 and 132, between the first contact plugs 122 and the second doped regions 112, and between the source lines SL and the first doped regions 111. The ohmic pattern may be formed of or include at least one metal-semiconductor compound including a metal silicide (e.g., cobalt silicide or titanium silicide).

The memory elements ME may be provided on the second interlayer insulating layer 130. Each of the memory elements ME may include the lower electrode BE, the magnetic tunnel junction MTJ, and the upper electrode TE. The magnetic tunnel junction MTJ may include the first magnetic layer MS1, the second magnetic layer MS2, and the tunnel barrier TBR therebetween. The memory elements ME may be configured to have one of the structures previously described with reference to FIGS. 3A and 3B. The memory elements ME may be coupled to the second contact plugs 132, respectively. The memory elements ME may be electrically connected to the second doped regions 112, respectively, via second contact plugs 132 and first contact plugs 122. As shown in FIG. 4, when viewed in plan view, the memory elements ME may be two-dimensionally arranged to form a plurality of rows and a plurality of columns. When viewed in vertical section, each of the memory elements ME may have a slanted sidewall profile.

Protection insulating patterns 140 may be provided around the memory elements ME. Each of the protection insulating patterns 140 may include a first protection insulating pattern 142 and a second protection insulating pattern 144. The protection insulating patterns 140 may be provided to cover or protect sidewalls of the memory elements ME. The first protection insulating pattern 142 may be provided to cover a lower side surface of each memory element ME and expose an upper side surface of each memory element ME. For example, the first protection insulating pattern 142 may cover the whole side surface of the magnetic tunnel junction MTJ and a portion of a side surface of the upper electrode TE. The first protection insulating pattern 142 may include, for example, silicon nitride and/or silicon oxynitride.

A lower mold layer 152 may be provided on the first protection insulating pattern 142. For example, the lower mold layer 152 may be provided between the memory elements ME covered with the first protection insulating patterns 142. The memory elements ME may be provided in the lower mold layer 152. The first protection insulating pattern 142 may be disposed between the memory elements ME and the lower mold layer 152. The lower mold layer 152 may expose top and upper side surfaces of each memory element ME. The lower mold layer 152 may be formed of, for example, silicon oxide.

The second protection insulating pattern 144 may be provided on a top surface of the lower mold layer 152. The second protection insulating pattern 144 may cover the upper side surface of each memory element ME and may be in contact with a top of the first protection insulating pattern 142. The second protection insulating pattern 144 may be spaced apart from the magnetic tunnel junction MTJ to cover the side surface of the upper electrode TE. The second protection insulating pattern 144 may be formed of a different material from the first protection insulating pattern 142. The second protection insulating pattern 144 may be formed to have a different etch property (e.g., an etch rate) different from or an etch selectivity with reference to the first protection insulating pattern 142. The second protection insulating pattern 144 may include at least one metal oxide. For example, the second protection insulating pattern 144 may include, for example, aluminum oxide, titanium oxide, or tantalum oxide.

An upper mold layer 154 may be provided on the second protection insulating layer 144. The second protection insulating layer 144 may be provided between the lower and upper mold layers 152 and 154. The upper mold layer 154 may be formed of or include the same material as the lower mold layer 152.

A bit line groove 155 may penetrate the upper mold layer 154 and the second protection insulating layer 144. The bit line groove 155 may extend parallel to the first direction D1. The bit line groove 155 may expose the top surfaces of the memory elements ME arranged in the first direction D1. When viewed in plan view, the bit line groove 155 may be overlapped with the active line patterns ALP. In example embodiments, a plurality of bit line grooves 155 may be provided spaced apart from each other in the second direction D2.

Bit lines BL may be provided in the bit line groove 155. Each of the bit lines BL may be in common and direct contact with top surfaces of plural ones of the memory elements ME. For example, the bit line BL may be connected to the memory elements ME without any contact plug interposed therebetween, and the fabrication process may be simplified and contact resistance between the bit line BL and the memory elements ME may be reduced. Further, uniformity in contact resistance between the bit line BL and the memory elements ME may be improved. The bit line BL may be provided spaced apart from the first protection insulating pattern 142. The second protection insulating pattern 144 may be provided between the bit line BL and the first protection insulating pattern 142.

Figure 6:
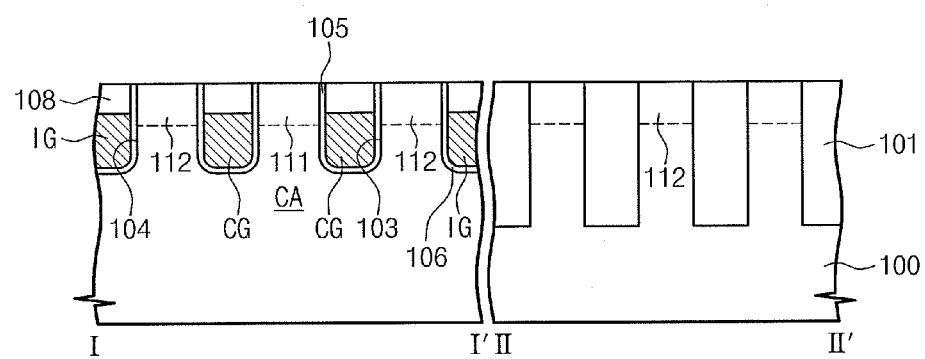
FIGS. 6 through 17 illustrate sectional views taken along lines I-I' and II-II' of FIG. 4 to illustrate a method of fabricating a magnetic memory device, according to example embodiments.

FIGS. 6 through 17 illustrate sectional views taken along lines I-I' and II-II' of FIG. 4 to illustrate a method of fabricating a magnetic memory device, according to example embodiments. Referring to FIGS. 4 and 6, the semiconductor substrate 100 may be prepared. The semiconductor substrate 100 may be a silicon substrate, a germanium substrate, and/or a silicon-germanium substrate. The semiconductor substrate 100 may have the first conductivity type.

The device isolation patterns 101 may be formed on the semiconductor substrate 100 to define the active line patterns ALP. The active line patterns ALP may be formed to be parallel to the first direction D1 of FIG. 4. The device isolation patterns 101 may be formed using a shallow trench isolation (STI) process.

The active line patterns ALP and the device isolation patterns 101 may be patterned to form the gate and isolation recess regions 103 and 104 extending parallel to the second direction D2 of FIG. 4. The isolation recess regions 104 may be formed to section each active line pattern ALP into a plurality of active patterns CA. The gate recess regions 103 may cross the cell active patterns CA. The gate and isolation recess regions 103 and 104 may be formed to have depths that are smaller than those of bottom surfaces of the device isolation patterns 101.

The cell gate dielectric layer 105 may be formed to conformally cover an inner surface of each gate recess region 103. The isolation gate dielectric layer 106 may also be formed to conformally cover an inner surface of each isolation recess region 104. In example embodiments, the cell and isolation gate dielectric layers 105 and 106 may be simultaneously formed using the same process. The cell and isolation gate dielectric layers 105 and 106 may be silicon oxide layers, which are formed by performing a thermal oxidation process on the semiconductor substrate 100. In an embodiment, the cell and isolation gate dielectric layers 105 and 106 may be formed of or include at least one of silicon oxide, silicon nitride, silicon oxynitride, or high-k dielectric materials including insulating metal oxides (e.g., hafnium oxide or aluminum oxide).

Next, a first conductive layer may be formed to fill the gate and isolation recess regions 103 and 104. The first conductive layer may be formed of or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide). The first conductive layer may be etched to form the cell gate electrode CG in each gate recess region 103 and the isolation gate electrode IG in each isolation recess region 104. The cell and isolation gate electrodes CG and IG may be recessed to have top surfaces that are lower than that of the semiconductor substrate 100.

The gate mask patterns 108 may be formed on the cell and isolation gate electrodes CG and IG to fill the gate and isolation recess regions 103 and 104 provided with the cell and isolation gate electrodes CG and IG. The gate mask pattern 108 may be formed of or include at least one of silicon oxide, silicon nitride, or silicon oxynitride.

Dopants may be injected into the cell active patterns CA between the cell gate electrodes CG to form the first and second doped regions 111 and 112 with the second conductivity type. Bottom surfaces of the first and second doped regions 111 and 112 may be formed at a level higher than a bottom level of the cell gate electrode CG.

Figure 7:
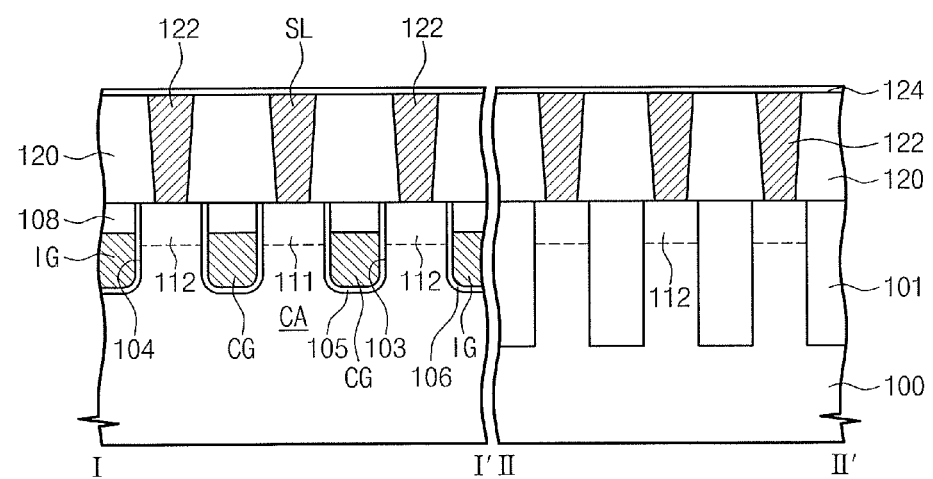

Referring to FIGS. 4 and 7, the first interlayer insulating layer 120 may be formed on the semiconductor substrate 100. The first interlayer insulating layer 120 may be formed of silicon oxide. The first interlayer insulating layer 120 may be patterned to form cell holes and source grooves.

A second conductive layer may be formed to fill the cell holes and the source grooves. The second conductive layer may be formed of or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide). A planarization process may be performed on the second conductive layer, until the second interlayer insulating layer 120 is exposed, and the first contact plugs 122 may be respectively formed in the cell holes and the source lines SL may be respectively formed in the source grooves. The first contact plugs 122 may be respectively connected to the second doped regions 112, and the source lines SL may be respectively connected to the first doped regions 111. In example embodiments, the ohmic patterns (not shown) may be formed between the source lines SL and the first doped regions 111 and between the first contact plugs 122 and the second doped regions 112. The ohmic pattern may be formed of or include at least one metal-semiconductor compound including a metal silicide (e.g., cobalt silicide or titanium silicide).

Thereafter, the capping insulating layer 124 may be formed on the first interlayer insulating layer 120, the first contact plugs 122, and the source lines SL. The capping insulating layer 124 may be formed of or include silicon nitride and/or silicon oxynitride.

Figure 8:
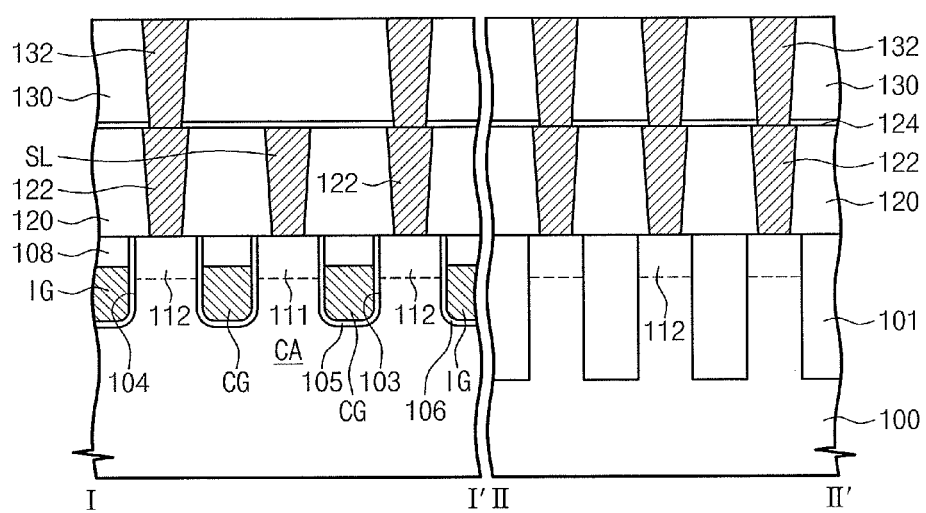

Referring to FIGS. 4 and 8, the second interlayer insulating layer 130 may be formed on the capping insulating layer 124. The second interlayer insulating layer 130 may be formed of silicon oxide. The second contact plugs 132 may be formed to penetrate both of the second interlayer insulating layer 130 and the capping insulating layer 124. The second contact plugs 132 may be formed by the same method as and of the same material as the first contact plugs 122. The second contact plugs 132 may be electrically and respectively connected to the second doped regions 112 through the first contact plugs 122. In example embodiments, the ohmic pattern (not shown) may be formed between the second contact plugs 132 and the first contact plugs 122. The ohmic pattern may be formed of or include at least one metal-semiconductor compound including a metal silicide (e.g., cobalt silicide or titanium silicide).

Figure 9:
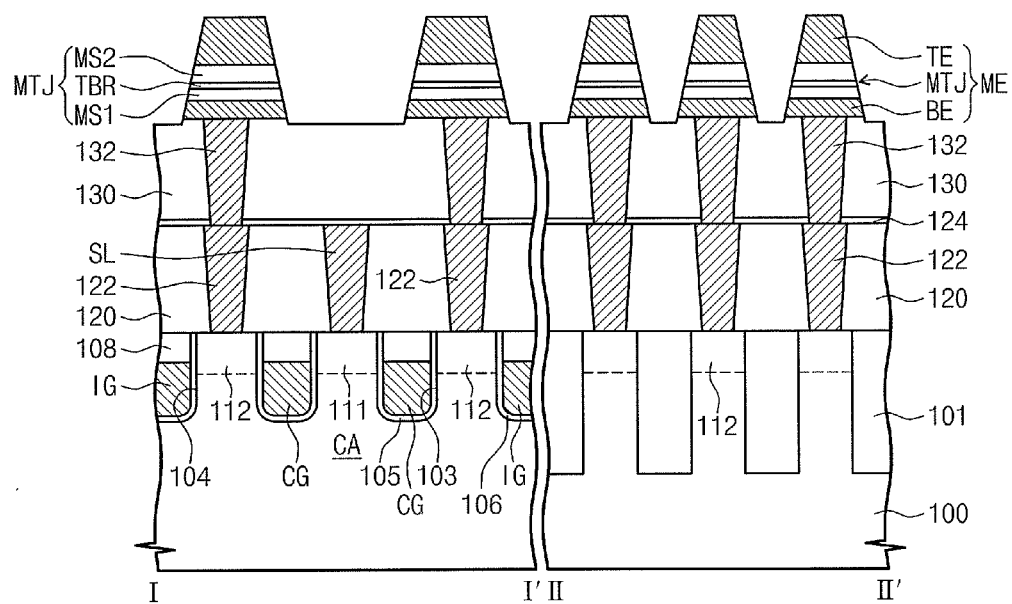

Referring to FIGS. 4 and 9, a memory layer may be formed on the second interlayer insulating layer 130. In example embodiments, the memory layer may include a lower electrode layer, a magnetic tunnel junction layer, and an upper electrode layer that are sequentially stacked on the second interlayer insulating layer 130.

The memory layer may be patterned to form the memory elements ME. The memory elements ME may be coupled to the second contact plugs 132, respectively. Each of the memory elements ME may include the lower electrode BE, the magnetic tunnel junction MTJ, and the upper electrode TE. The magnetic tunnel junction MTJ may include the first magnetic layer MS1, the second magnetic layer MS2, and the tunnel barrier TBR interposed therebetween. The memory elements ME may be formed to have the technical features as described with reference to FIG. 3A or FIG. 3B. When viewed in vertical section, each of the memory elements ME may be formed to have a slanted sidewall profile. In certain embodiments, the memory layer may be over-etched during the patterning process, and a top surface of the second interlayer insulating layer 130 may be partially recessed.

Figure 10:
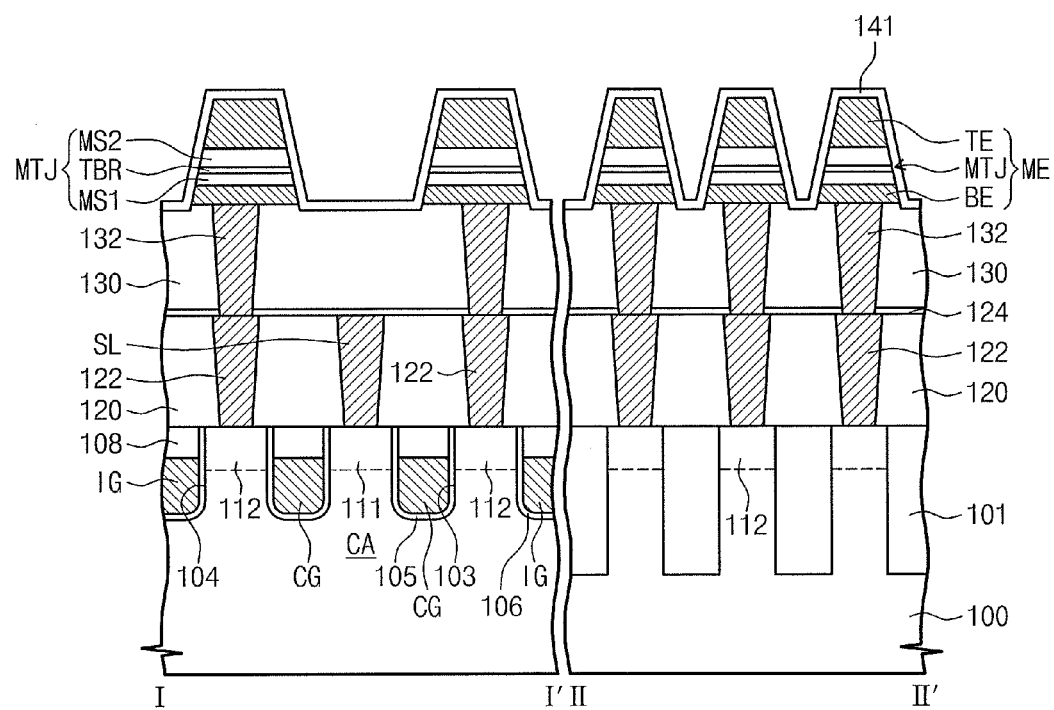

Referring to FIGS. 4 and 10, a first protection insulating layer 141 may be conformally formed to wholly cover the structure provide with the memory elements ME. The first protection insulating layer 141 may be formed using a chemical vapor deposition process and/or an atomic layer deposition process. The first protection insulating layer 141 may be formed at temperature of about 300° C. or lower. The first protection insulating layer 141 may be formed at a higher temperature than 300° C., and the magnetic tunnel junction MTJ may be damaged. The first protection insulating layer 141 may be formed of or include silicon nitride and/or silicon oxynitride.

Figure 11:
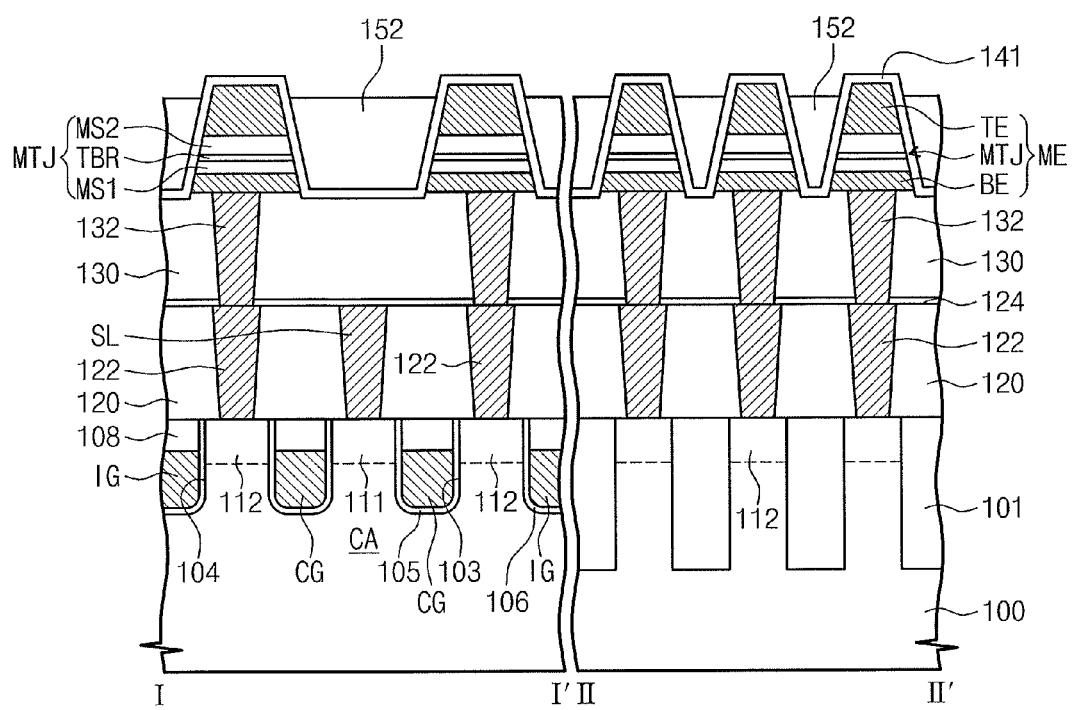

Referring to FIGS. 4 and 11, the lower mold layer 152 may be formed on the first protection insulating layer 141. For example, the lower mold layer 152 may be formed to fill gap region between the memory elements ME. The lower mold layer 152 may be formed to have an etch selectivity with reference to the first protection insulating layer 141. The lower mold layer 152 may be formed of, for example, silicon oxide. The lower mold layer 152 may be recessed to expose upper portions of the first protection insulating layer 141 located on the memory elements ME. In certain embodiments, the lower mold layer 152 may be formed to expose upper side portions of the first protection insulating layer 141 located on upper side surfaces of the memory elements ME.

Figure 12:
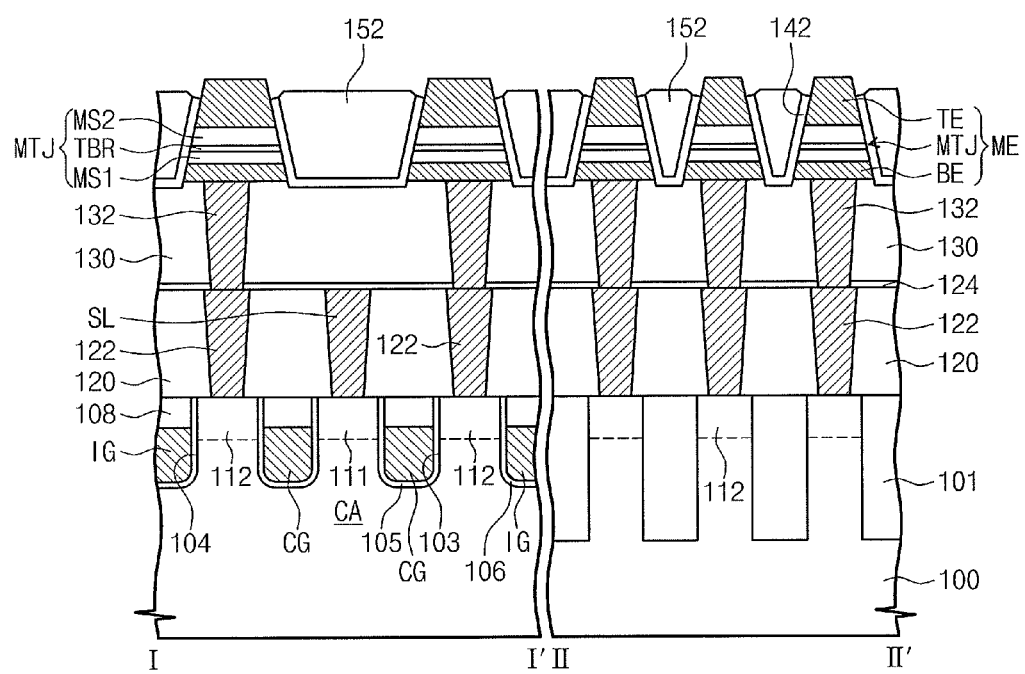

Referring to FIGS. 4 and 12, the exposed portions of the first protection insulating layer 141 may be removed to form the first protection insulating pattern 142 exposing the top and upper side surfaces of the memory elements ME. The removal of the first protection insulating layer 141 may be performed using an etching solution (for example, containing phosphoric acid) capable of etching the first protection insulating layer 141 with an etch selectivity over the lower mold layer 152.

Figure 13:
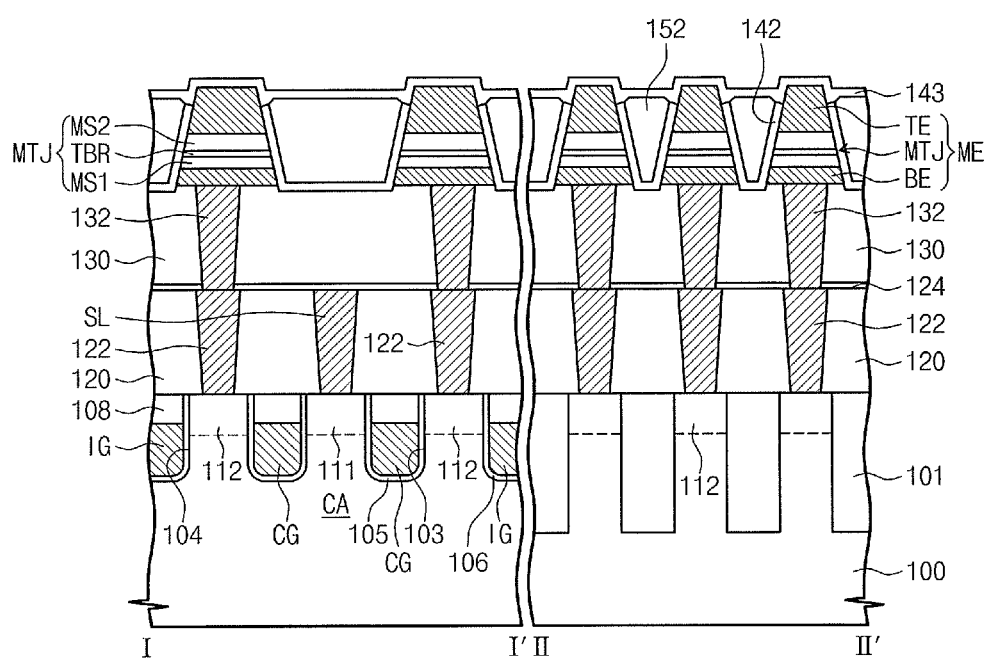

Referring to FIGS. 4 and 13, a second protection insulating layer 143 may be formed to cover top surfaces of the lower mold layer 152 and the memory elements ME. The second protection insulating layer 143 may cover the upper side surfaces of the memory elements ME and may be in contact with the top portion of the first protection insulating pattern 142. The second protection insulating layer 143 may not be in contact with the magnetic tunnel junction MTJ. The second protection insulating layer 143 may be formed of a different material from the first protection insulating layer 142. The second protection insulating layer 143 may be formed to have an etch selectivity with reference to the first protection insulating layer 142. For example, the second protection insulating layer 143 may be formed of or include metal oxide. As an example, the second protection insulating layer 143 may include aluminum oxide, titanium oxide, or tantalum oxide.

Figure 14:
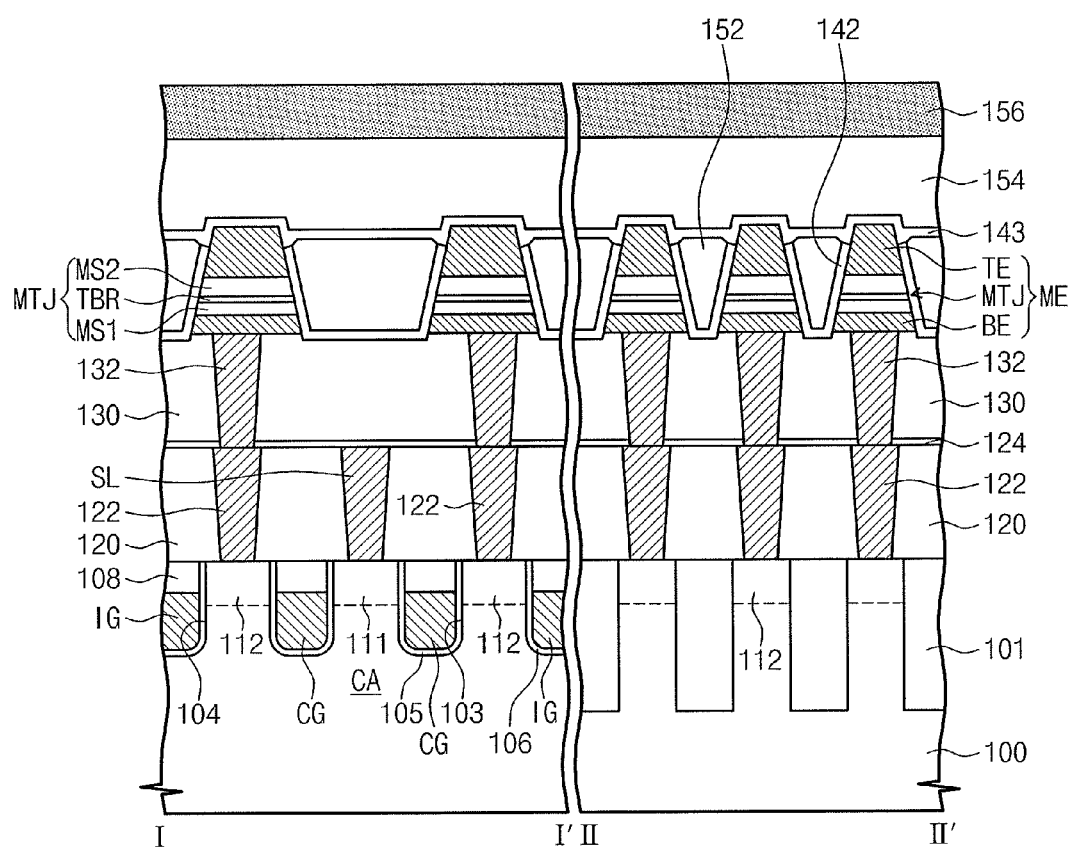

Referring to FIGS. 4 and 14, the upper mold layer 154 may be formed on the second protection insulating layer 143. The upper mold layer 154 may be formed of or include the same material as the lower mold layer 152. A hard mask pattern 156 may be formed on the upper mold layer 154. The hard mask pattern 156 may be formed of a titanium nitride layer. The hard mask pattern 156 may be formed at a low temperature (for example, of about 300° C. or lower), and the magnetic tunnel junction MTJ may be prevented from deteriorating. The hard mask pattern 156 may be formed of a titanium nitride layer, and it may be formed using, for example, a sputtering process.

Figure 15:
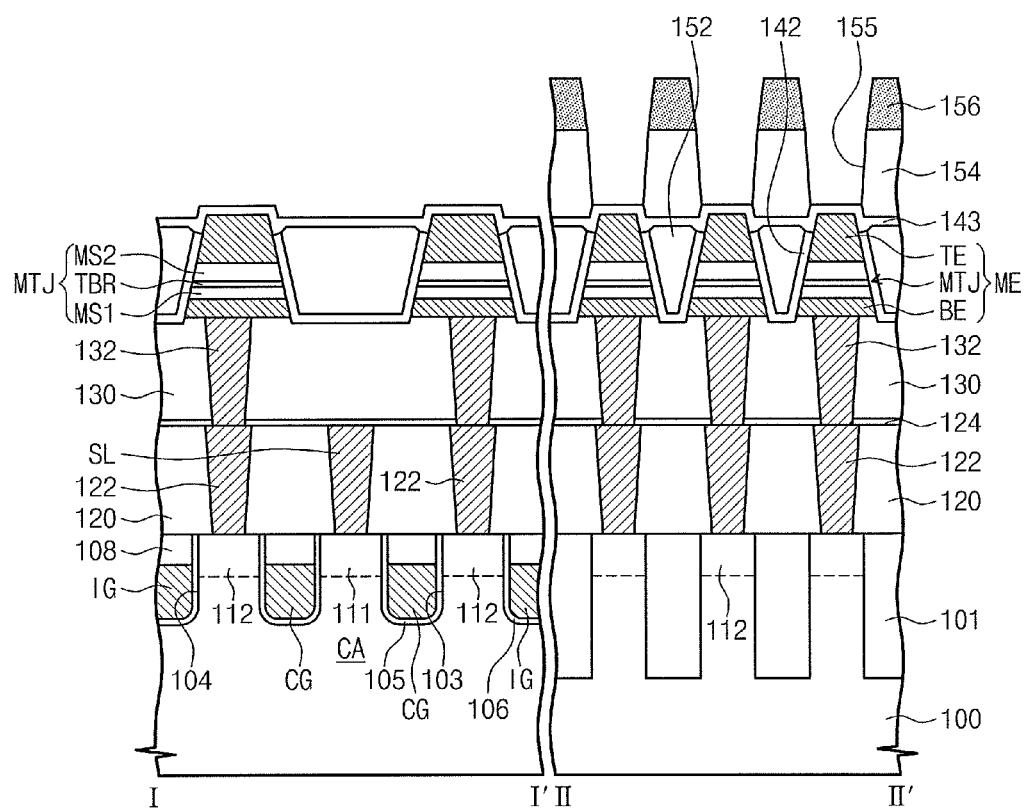

Referring to FIGS. 4 and 15, the upper mold layer 154 may be etched using the hard mask pattern 156 as a mask to form the bit line grooves 155 in the upper mold layer 154. The bit line grooves 155 may be formed to expose the second protection insulating layer 143. The bit line grooves 155 may extend parallel to the first direction D1. The etching of the upper mold layer 154 may be performed using a dry etching process. The hard mask pattern 156 may be formed of a titanium nitride layer, and it may be etched during the dry etching process. For example, the hard mask pattern 156 may be formed of a low-temperature titanium nitride layer, and the hard mask pattern 156 may have an easier-to-be-etched property in the dry etching process, compared with a high temperature titanium nitride layer.

Figure 16:
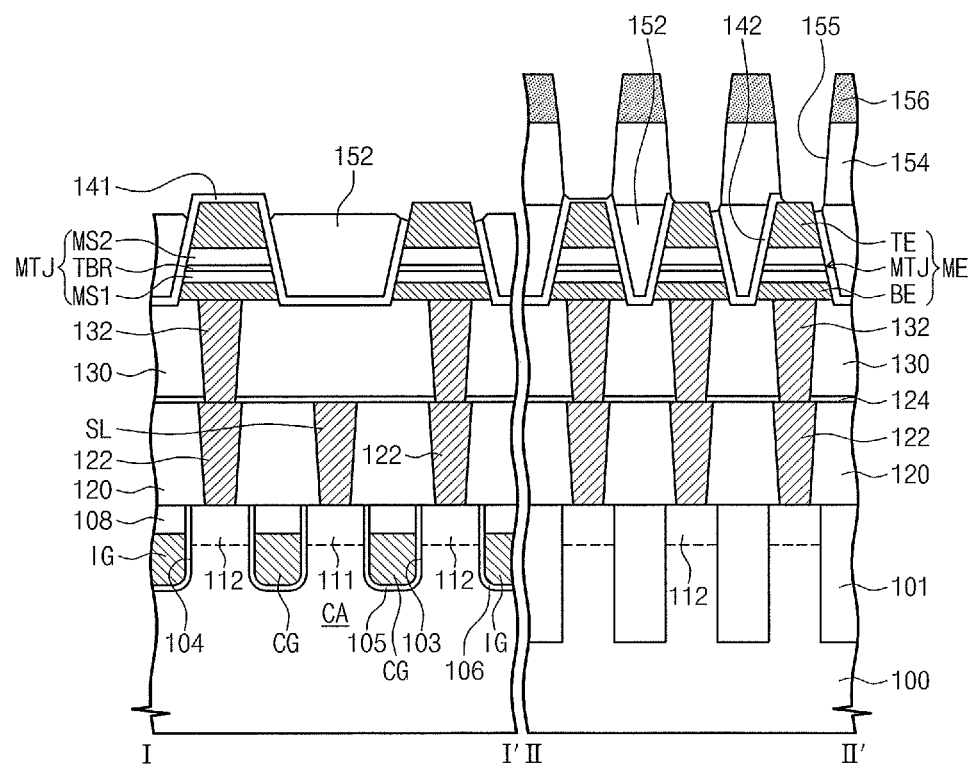

In addition, according to a comparative technology, the first protection insulating layer 141 may cover the memory element ME, without the second protection insulating layer 143 shown in FIG. 16. The first protection insulating layer 141 may be formed of a silicon nitride layer or a silicon oxynitride layer, and a nitrogen signal may be used as an end point detection (EPD) signal in the dry etching process. The hard mask pattern 156 may be formed of a low-temperature titanium nitride layer, not only the first protection insulating layer 141 but also the hard mask pattern 156 may serve as a source material producing the nitrogen signal, and the dry etching process may be performed based on an incorrect EPD signal. For example, as shown in FIG. 16, it may be difficult to precisely control an etching uniformity in the dry etching process wafer; for example, a partial-non-opening or over-etching may occur, which will be described in more detail with reference to FIGS. 18A and 18B.

According to example embodiments, as shown in FIG. 15, unlike the first protection insulating layer 141, the second protection insulating layer 143 may be formed of a nitrogen-free material, the second protection insulating layer 143 may not serve as a source material producing the nitrogen signal in the dry etching process, and even when the hard mask pattern 156 is formed of the low-temperature titanium nitride layer, the dry etching process may be prevented from being disturbed by an incorrect EPD signal. In addition, the second protection insulating layer 143 may have a higher etch selectivity with respect to the upper mold layer 154 than that of the first protection insulating layer 141. For example, the second protection insulating layer 143 and the upper mold layer 154 may be formed to have an etch selectivity of about 10:1 or higher, and the second protection insulating layer 143 may be prevented from being over-etched, even when the upper mold layer 154 is excessively over-etched to control the etching uniformity of the dry etching process over a wafer.

Figure 17:
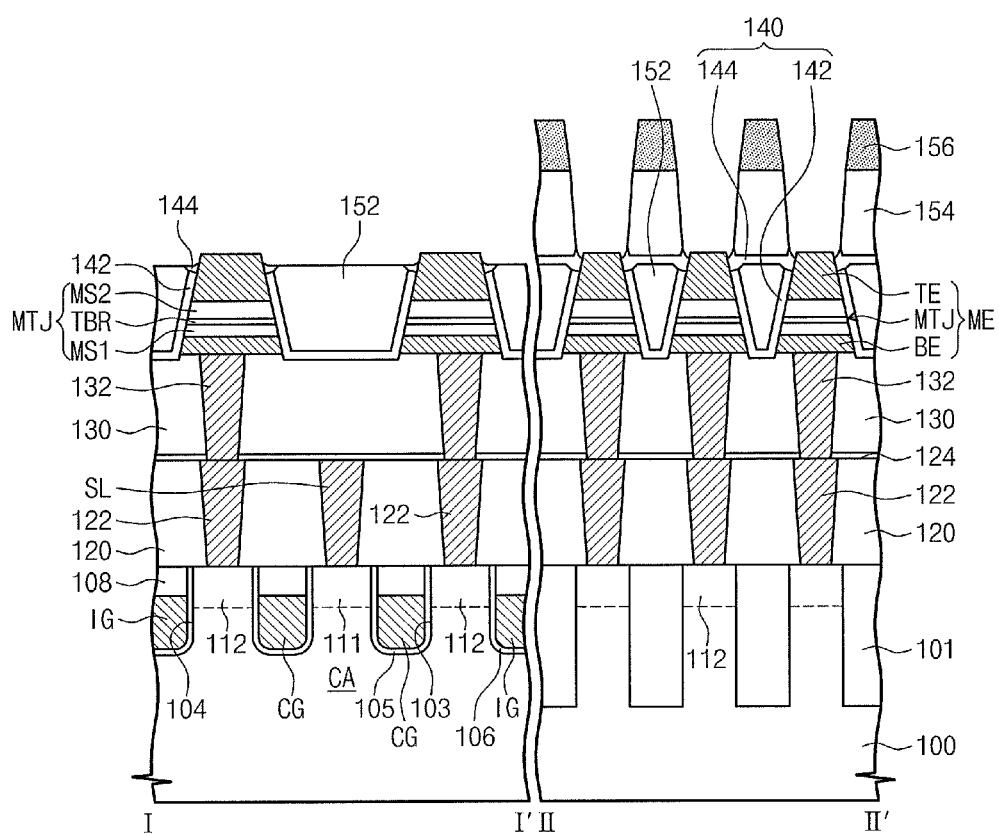

Referring to FIGS. 4 and 17, portions of the second protection insulating layer 144 exposed through the bit line grooves 155 may be selectively etched to expose the top surfaces of the memory elements ME. Each of the bit line grooves 155 may be formed to expose the top surfaces of plural ones of the memory elements ME arranged in the first direction D1. In example embodiments, the etching of the second protection insulating layer 144 may be performed using, for example, a wet etching solution (e.g., LAL) containing HF and NH$_4$F.

Thereafter, referring back to FIGS. 4 and 5, a third conductive layer may be formed to fill the bit line grooves 155. A planarization process may be performed on the third conductive layer, until the second mold layer 154 is exposed, and the bit lines BL may be formed in the bit line grooves 155, respectively. In certain embodiments, the hard mask pattern 156 may be removed in the planarization process. The bit lines BL may be formed of a metal-containing material. For example, the bit lines BL may be formed of or include aluminum or copper. The bit lines BL may be formed of a copper-containing material, and the bit line BL may be formed using a plating process and a seed layer for the plating process may be additionally formed to conformally cover inner surfaces of the bit line grooves 155. The bit lines BL may be formed using the copper-plating process, a process temperature for forming the bit line BL may be reduced, compared with the case that the bit line BL are formed of other material, and reliability of the magnetic tunnel junction MTJ or the memory element ME may be prevented from deteriorating. In some embodiments, the bit line BL may further include a barrier metal layer and/or an adhesive metal layer.

In a comparative method, the bit line BL may be connected to the memory elements ME through contact plugs. As magnetic memory devices are being scaled down, it may become difficult to form a seed layer for the copper plating process in contact holes for the contact plugs. According to example embodiments, the bit line groove 155 is formed to allow for easy formation of the copper seed layer, and a highly-integrated magnetic memory device may be realized, e.g., easily realized.

Figure 18A:
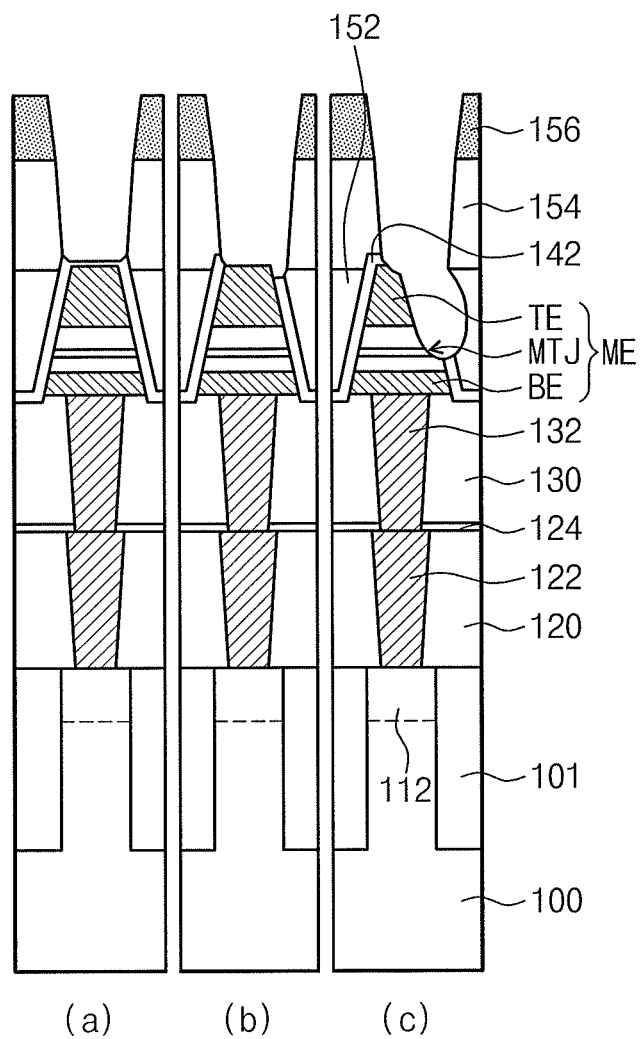
FIGS. 18A and 18B illustrate sectional views of bit line grooves formed by example embodiments and a comparative method, respectively.
Figure 18B:
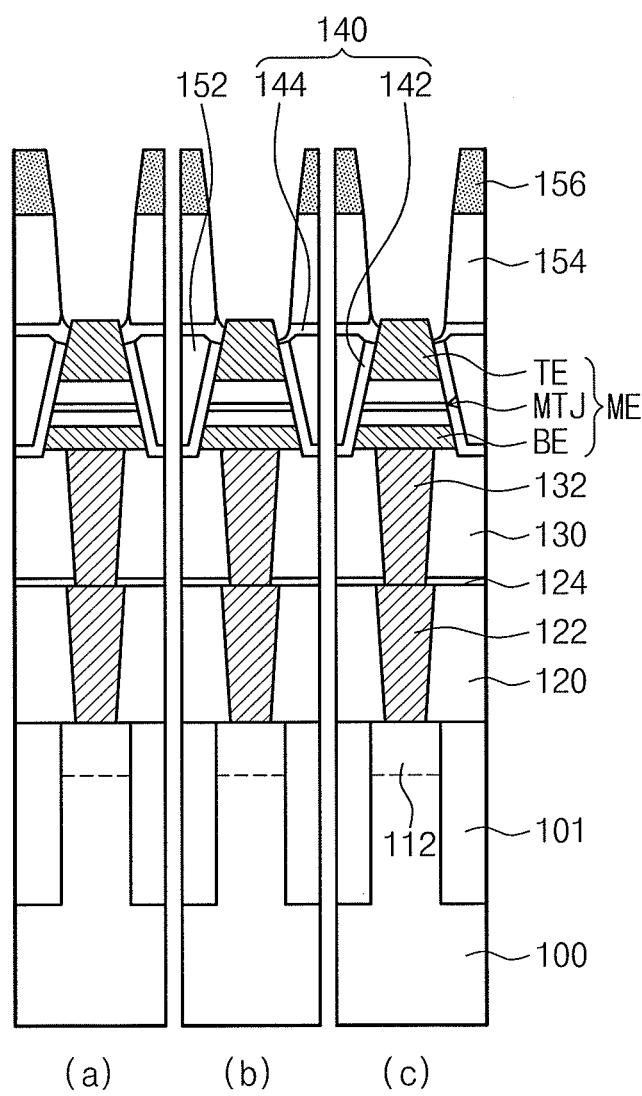

FIGS. 18A and 18B illustrate sectional views provided for comparison between a comparative process, in which the second protection insulating layer is not used, and the proposed process according to example embodiments, in which the second protection insulating layer is used, and the afore-described dry etching process will be described in more detail with reference to FIGS. 18A and 18B.

Referring to FIGS. 18A and 18B, a partial misalignment may occur in the process of forming the hard mask pattern 156 of FIG. 14. Further, it may be difficult to control etching uniformity in the dry etching process of FIG. 16. For example, sections (a), (b), and (c) of FIG. 18A show examples of not-open, small over-etching, and large over-etching issues which occur in the dry etching process. If there is a misalignment or over-etching issues of FIG. 18A, not only the first protection insulating layer 141 but also the upper electrode TE and the magnetic tunnel junction MTJ may be damaged in the dry etching process of FIG. 16. When the bit line BL is formed in the bit line groove 155, an electric short circuit may be produced in the memory element ME (for example, between the free and pinned layers). An area of the side surface of the memory element ME exposed by a misalignment may be larger when the afore-described process is used than when a comparative process is used, and an over-etching may occur more seriously when the bit line BL is formed in the bit line groove 155, like in the afore-described process, compared with a comparative process, in which contact plugs are used to connect the memory elements ME to the bit line BL.

According to example embodiments, as shown in FIG. 18B, even if there is a misalignment, the second protection insulating layer 144 may help prevent the memory element ME from being over-etched in the dry etching process of FIG. 16. The memory element ME may be protected by the second protection insulating layer 144, and the magnetic memory device may be fabricated to have good reliability. Sections (a), (b) and (c) of FIG. 18B may correspond to those of FIG. 18A.

Figure 19:
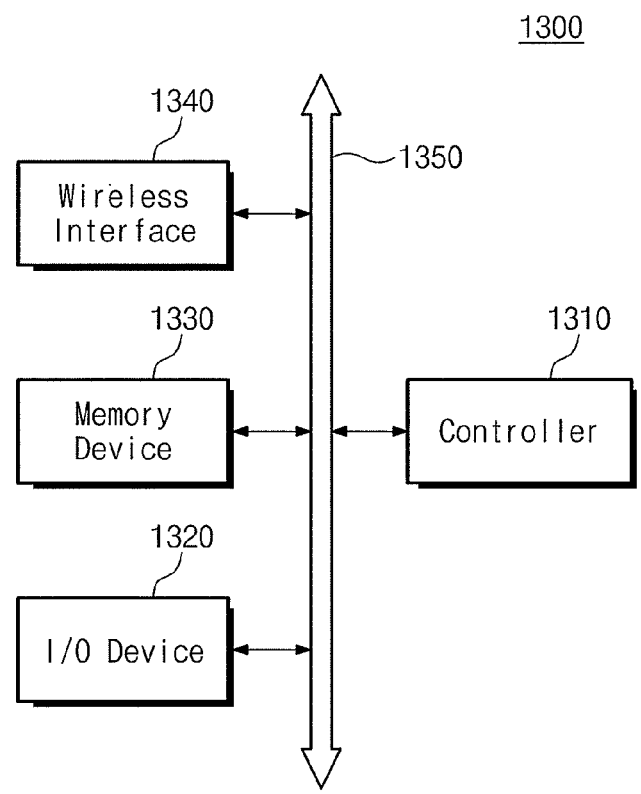
FIG. 19 illustrates a schematic block diagram of an example of electronic systems including a memory device according to example embodiments.

FIG. 19 illustrates a schematic block diagram of an example of electronic systems including a memory device according to example embodiments. Referring to FIG. 19, an electronic system 1100 according to example embodiments may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other via the data bus 1150. The data bus 1150 may correspond to a path through which electrical signals are transmitted. The memory device 1130 may be configured to include one of memory devices according to example embodiments.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 20:
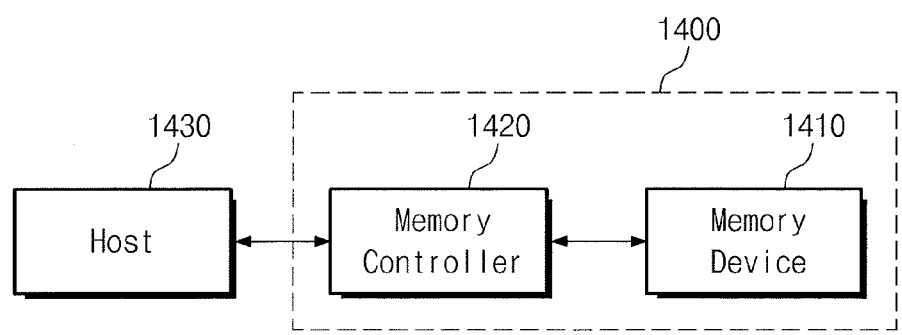
FIG. 20 illustrates a schematic block diagram of an example of memory systems including the memory devices according to the embodiments.

FIG. 20 illustrates a schematic block diagram of an example of memory systems including the memory devices according to the embodiments. Referring to FIG. 20, a memory system 1200 according to example embodiments may include a memory device 1210. The memory device 1210 may include at least one of the memory devices according to the afore-described embodiments. In other embodiments, the memory device 1210 may further include a memory device, which is of a different type from the memory devices according to the afore-described embodiments. For example, the memory device 1210 may further include a nonvolatile memory device and/or a static random access memory (SRAM) device. The memory system 1200 may include a memory controller 1220 that controls data communication between a host and the memory device 1210. The memory device 1210 and/or the memory controller 1220 may be configured to include at least one of the memory devices according to example embodiments.

The memory controller 1220 may include a processing unit 1222 that controls overall operations of the memory system 1200. In addition, the memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory system 1200 may further include a read only memory (ROM) device that stores code data to interface with the host. The memory system 1200 may be used as a portable data storage card. In an embodiment, the memory system 1200 may be provided in the form of solid state disks (SSD), instead of hard disks of computer systems.

By way of summation and review, a backend process of STT-MRAM (spin transfer torque-magnetoresistive random-access memory) device may be difficult. For example, there may be several difficulties in forming bit line contacts (BLC) of the STT-MRAM device. The BLC process may be performed after forming MTJ patterns that may be vulnerable to heat, and a low-temperature TiN hard mask may be used to help prevent MTJs from deteriorating in the BLC process.

A low-temperature TiN hard mask may be used to etch a BLC mold, the low-temperature TiN hard mask may also be etched to produce a signal that may be hardly distinguished from an EPD signal produced from a SiN layer serving as an etch-stopping layer, and there may be several technical difficulties in controlling etch uniformity of the etching process over a wafer and in preventing an electric short of the MTJ or a not-open failure in the etching process.

Various problems, such as stopper not-open and MgO short (for example, between free and pinned layers) may occur at the same time, when the etching process suffers from poor etch uniformity, i.e., when there is a failure in controlling etch uniformity of the etching process.

Example embodiments provide a magnetic memory device that includes an MTJ. The MTJ may include two magnetic layers and a tunnel barrier layer interposed therebetween. Resistance of the MTJ may vary depending on magnetization directions of the magnetic layers. For example, the resistance of the MTJ may be higher when magnetization directions of the magnetic layers are anti-parallel than when they are parallel. Such a difference in resistance may be used to store data in a magnetic memory device.

According to example embodiments, a low-temperature hard mask may be used, uniformity in contact resistance of the bit line may be improved, and reliability of the magnetic memory device may be improved. In addition, the bit line may be in direct contact with the top surface of the memory element, electric resistance between the bit line and the memory element may be minimized, and a highly-reliable and highly-integrated magnetic memory device may be realized.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a memory element on a substrate;

a protection insulating pattern covering a side surface of the memory element and exposing a top surface of the memory element;
an upper mold layer on the protection insulating pattern; and
a bit line on and connected to the memory element, the bit line extending in a first direction,
the protection insulating pattern including:
a first protection insulating pattern covering a lower side surface of the memory element; and
a second protection insulating pattern covering and contacting an upper side surface of the memory element and including a different material from the first protection insulating pattern,
wherein the second protection insulating pattern includes metal oxide.

2. The memory device as claimed in claim 1, wherein:
the bit line is in direct contact with the top surface of the memory element, and
the second protection insulating pattern is between the bit line and the first protection insulating pattern.

3. The memory device as claimed in claim 1, further comprising a lower mold layer between the substrate and the upper mold layer,
wherein:
the memory element is in the lower mold layer,
the first protection insulating pattern is between the memory element and the lower mold layer, and
the second protection insulating pattern includes a portion between the lower and upper mold layers.

4. The memory device as claimed in claim 1, wherein the second protection insulating pattern includes aluminum oxide, titanium oxide, or tantalum oxide.

5. The memory device as claimed in claim 4, wherein the first protection insulating pattern includes silicon nitride or silicon oxynitride.

6. The memory device as claimed in claim 1, wherein the memory element includes:
a lower electrode;
a magnetic tunnel junction on the lower electrode, the magnetic tunnel junction including a pinned layer, a free layer, and a tunnel barrier between the pinned and free layers; and
an upper electrode on the magnetic tunnel junction.

7. The memory device as claimed in claim 6, wherein the first protection insulating pattern covers a side surface of the magnetic tunnel junction and a lower side surface of the upper electrode.

8. The memory device as claimed in claim 7, wherein the second protection insulating pattern is spaced apart from the magnetic tunnel junction and covers an upper side surface of the upper electrode.

9. The memory device as claimed in claim 1, further comprising a gate electrode, at least one interlayer insulating layer, and a contact plug,
wherein:
the substrate includes a cell active pattern extending in the first direction,
the gate electrode crosses the cell active pattern,
the cell active pattern includes first and second doped regions at both sides of the gate electrode,
the at least one interlayer insulating layer covers the substrate,
the contact plug is disposed through the at least one interlayer insulating layer and is connected to the second doped region, and
the memory element is on the interlayer insulating layer and is electrically connected to the second doped region via the contact plug.

10. The memory device as claimed in claim 9, wherein the upper mold layer is formed to include a bit line groove extending across the gate electrode, and the bit line is in the bit line groove.

11. The memory device as claimed in claim 10, further comprising a plurality of additional memory elements, which are arranged in the first direction to have the same structure as the memory element, wherein the bit line is in common and direct contact with top surfaces of the memory element and the plurality of additional memory elements.

12. The memory device as claimed in claim 10, wherein the bit line groove penetrates the second protection insulating pattern.

13. The memory device as claimed in claim 1, wherein the bit line is in contact with upper portions of both side surfaces of the memory element facing each other in the first direction.

14. A memory device, comprising:
a magnetic memory element on a substrate;
a first protection insulating layer covering a side surface of the magnetic memory element and including nitrogen; and
a second protection insulating layer on the first protection insulating layer, directly contacting the magnetic memory element and exposing a top surface of the magnetic memory element, and including a nitrogen-free material; and
an upper mold layer on the second protection insulating layer,
the second protection insulating layer having a higher etch selectivity with respect to the upper mold layer than that of the first protection insulating layer.

15. The memory device as claimed in claim 14, wherein the second protection insulating layer and the upper mold layer have an etch selectivity of about 10:1 or higher.

16. The memory device as claimed in claim 15, wherein the second protection insulating layer includes a metal oxide.

17. The memory device as claimed in claim 16, wherein:
the first protection insulating layer includes silicon nitride or silicon oxynitride; and
the second protection insulating layer includes aluminum oxide, titanium oxide, or tantalum oxide.

* * * * *